United States Patent
Yuan et al.

(10) Patent No.: US 7,902,926 B2
(45) Date of Patent: *Mar. 8, 2011

(54) COMMUNICATION SYSTEM AND OSCILLATION SIGNAL PROVISION METHOD

(75) Inventors: Ti-Wen Yuan, Hsinchu County (TW); Chung-Shine Huang, Taipei Hsien (TW)

(73) Assignee: Mediatek Inc., Hsin-Chu (TW)

( * ) Notice: Subject to any disclaimer, the term of this patent is extended or adjusted under 35 U.S.C. 154(b) by 71 days.

This patent is subject to a terminal disclaimer.

(21) Appl. No.: 12/426,319

(22) Filed: Apr. 20, 2009

(65) Prior Publication Data

US 2009/0201092 A1   Aug. 13, 2009

Related U.S. Application Data

(63) Continuation-in-part of application No. 11/748,004, filed on May 14, 2007, now Pat. No. 7,656,235.

(60) Provisional application No. 60/806,135, filed on Jun. 29, 2006.

(51) Int. Cl.
H03L 7/00 (2006.01)
(52) U.S. Cl. ............................... 331/2; 331/18; 331/172
(58) Field of Classification Search ............ 331/2, 172, 331/18; 713/324
See application file for complete search history.

(56) References Cited

U.S. PATENT DOCUMENTS

| 5,918,061 A | 6/1999 | Nikjou |
| 6,369,643 B1 * | 4/2002 | Lee et al. ............... 327/544 |
| 6,927,641 B2 | 8/2005 | Terasawa et al. |
| 2004/0132421 A1 | 7/2004 | Underbrink |

FOREIGN PATENT DOCUMENTS

WO    2005064965    7/2005

OTHER PUBLICATIONS

CN Office Action mailed Jun. 19, 2009.

* cited by examiner

*Primary Examiner* — Joseph Chang
(74) *Attorney, Agent, or Firm* — Thomas | Kayden

(57) ABSTRACT

An embodiment of a communication system is provided, in which a high frequency oscillator generates a first high frequency signal upon receipt of no disable signal. The first high frequency signal is commonly shared by at least two modules. Each module coupled to the high frequency oscillator operates in either busy or idle mode, wherein the module operates at the first high frequency signal when in busy mode, and asserts a request signal when in idle mode. A disablement unit, coupled to the first and second modules, asserts the disable signal to the high frequency oscillator when all of the request signals are asserted, thereby forcing the high frequency oscillator to cease the generation of the first high frequency signal.

24 Claims, 17 Drawing Sheets

| #en1 | #en2 | #en3 | #en |
|------|------|------|-----|
| 1 | 1 | 1 | 1 |
| 1 | 1 | 0 | 1 |
| 1 | 0 | 1 | 1 |
| 0 | 1 | 1 | 1 |
| 1 | 0 | 0 | 1 |
| 0 | 0 | 1 | 1 |
| 0 | 1 | 0 | 1 |
| 0 | 0 | 0 | 0 |

COMMUNICATION SYSTEM AND OSCILLATION SIGNAL PROVISION METHOD

CROSS REFERENCE TO RELATED APPLICATIONS

This application is a continuation-in-part (CIP) of U.S. patent application entitled "Communication System and Oscillation Signal Provision Method," Ser. No. 11/748,004, filed on May 14, 2007, which claims the priority of US provisional application entitled "Common Oscillator In Mobile Station," Ser. No. 60/806,135, filed on Jun. 29, 2006, the entirety of which are incorporated by reference herein.

BACKGROUND OF THE INVENTION

1. Field of the Invention

The invention relates to mobile phone systems, and more particularly, to a common oscillation source simultaneously serving multiple communication chips in one device.

2. Description of the Related Art

FIG. 1 shows a conventional communication system 100. Currently, mobile phones provide various functionalities in addition to telephone communication. For example, in FIG. 1, a mobile module 110, a Bluetooth module 120 and a WiFi module 130 are simultaneously implemented in one device, each operating at different frequencies. Specifically, according to known power saving technologies, these modules may operate in either a busy mode or an idle mode, with different frequency sources required. The mobile module 110 uses a first high oscillator 112 for busy mode, and an oscillation source 114 for idle mode. Likewise, the Bluetooth module 120 and WiFi module 130 also require corresponding high and low frequency oscillators 122, 132, 124 and 134 in either mode. The disadvantage of the architecture is that since two oscillators are required for each module, circuit redundancies and costs proportionally increase when multiple modules are implemented together. Additionally, the total power consumption of the oscillators is significant. When all modules are operating in the busy mode, a power shortage may quickly occur, reducing the mobility of the communication system 100. Thus, a more efficient architecture is desirable.

BRIEF SUMMARY OF THE INVENTION

An embodiment of a communication system is provided, in which a high frequency oscillator generates a first high frequency signal upon receipt of no disable signal. The first high frequency signal is commonly shared by at least two modules. Each module coupled to the high frequency oscillator operates in either busy or idle mode, wherein the module operates at the first high frequency signal when in busy mode, and asserts a request signal when in idle mode. A disablement unit, coupled to the first and second modules, asserts the disable signal to the high frequency oscillator when all of the request signals are asserted, thereby forcing the high frequency oscillator to cease the generation of the first high frequency signal.

Another embodiment provides an oscillation signal provision method based on the communication system described, with detailed description given in the following embodiments with reference to the accompanying drawings.

An embodiment of a communication system is provided, in which a high frequency oscillator generates a first high frequency signal upon receipt of an enable signal. The first high frequency signal is commonly shared by at least two modules. Each module coupled to the high frequency oscillator operates in either busy or idle mode, wherein the module operates at the first high frequency signal when in busy mode, and asserts a request signal when in idle mode. A enablement unit, coupled to the modules, asserts the enable signal to the high frequency oscillator when at least one request signal is asserted. The high frequency oscillator ceases the generation of the first high frequency signal when the enable signal is not asserted.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 2A:
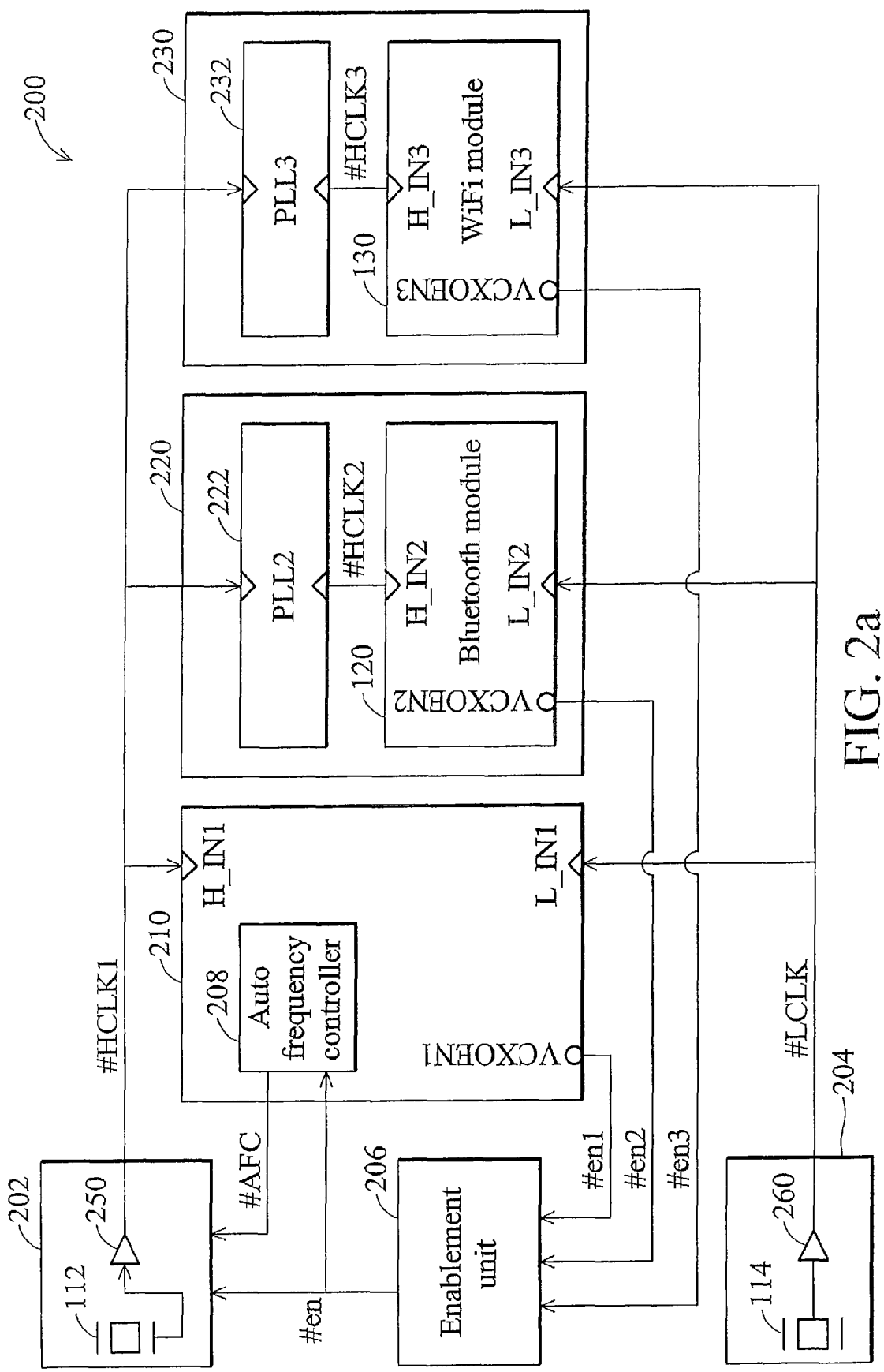
FIGS. 2a, 2b, 10a and 10b show embodiments of communication systems according to the invention.
Figure 2B:
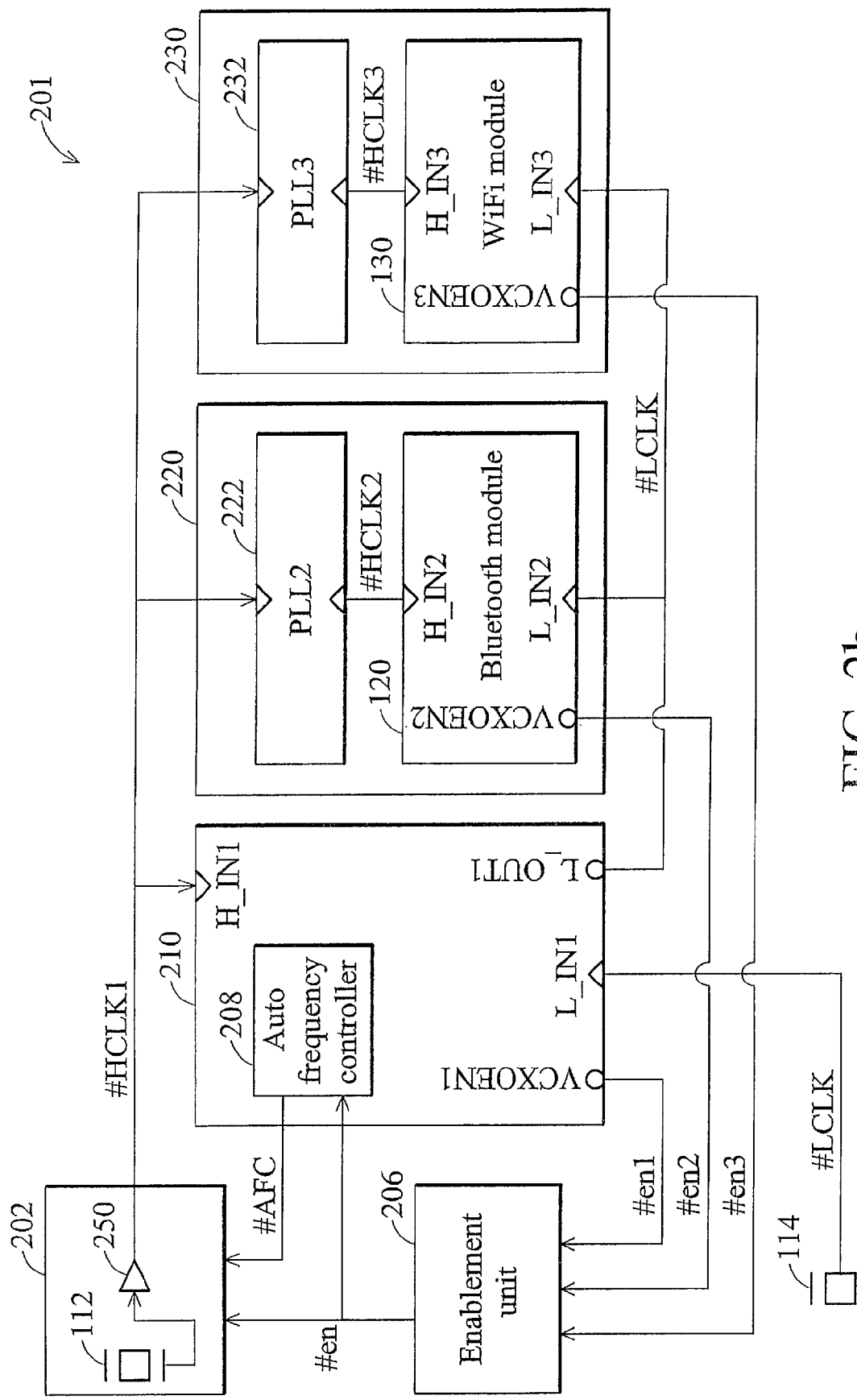

FIGS. 2a and 2b show embodiments of communication systems 200 and 201 according to the invention. In FIG. 2a, a communication system 200 comprises a first module 210, a second module 220 and a third module 230 sharing one high frequency oscillator 202 and one low frequency oscillator 204. The high frequency oscillator 202 generates first high frequency signal #HCLK1 for operations in busy mode, and the low frequency oscillator 204 generates a low frequency signal #LCLK for idle mode. The high frequency oscillator 202 is enabled by an enable signal #en sent from an enablement unit 206 coupled to the first module 210, second module 220 and third module 230. When one of the first module 210, second module 220 and third module 230 switches to busy mode, a corresponding one of request signals #en1, #en2 or #en3 is delivered to the enablement unit 206. The enable signal #en is asserted if any of the request signals #en1, #en2 and #en3 is asserted, and the high frequency oscillator 202 is enabled to generate the first high frequency signal #HCLK1. Conversely, if none of the request signals #en1, #en2 and #en3 is asserted, the enable signal #en is not sent to enable the high frequency oscillator 202, and the high frequency oscillator 202 may cease to work, reducing the total power consumption of the communication system 200. Since the high frequency oscillator 202 is simultaneously coupled to multiple modules, the pushing power of the first high frequency signal #HCLK1 is important. The high frequency oscillator 202 comprises a first high oscillator 112 as a source of the first high frequency signal #HCLK1, and a first buffer 250 coupled to the first high oscillator 112. The first high frequency signal #HCLK1 is amplified to gain the pushing power before output to the first module 210, second module 220 and third module 230. Likewise, the low frequency oscillator 204 comprises an oscillation source 114 as a source of the low frequency signal #LCLK, and a second buffer 260 coupled to the oscillation source 114, amplifying the low frequency signal #LCLK to gain the pushing power thereof. When any of the first module 210, second module 220 or third module 230 switches to idle mode, the low frequency signal #LCLK is used for corresponding operations.

Alternatively in the communication system 201 of FIG. 2b, the low frequency signal #LCLK is provided by oscillation source 114 specially coupled to the first module 210. The second buffer 260 as shown in FIG. 2a is removed, and the low frequency signal #LCLK is amplified by the first module 210 before outputting via an output terminal L_OUT1, from which the second module 220 and third module 230 receives the low frequency signal #LCLK for idle mode operations. Generally, the low frequency signal #LCLK may range from 32 KHz to 32.768 KHz, and accuracy thereof is not strictly required. The range of low frequency signal #LCLK is not limited, and any frequency below 100 KHz may be covered to be the low frequency signal #LCLK. Conversely, the first high frequency signals #HCLK1, #HCLK2 and #HCLK3 used in busy mode are required to be accurate. The first module 210 may be a mobile phone chip following communication standard such as Global System for Mobile Communication (GSM), General Packet Radio Service (GPRS), and Enhanced Data rates for GSM Evolution (EDGE), Wideband Code Division Multiple Access (WCDMA) or Code Division Multiple Access (CDMA), and the first high frequency signal #HCLK1 is for example, 13 MHz. The second module 220 may be a Bluetooth chip using a second high frequency signal #HCLK2 of, for example, 16 MHz, and the third module 230 may be a WiFi chip using a third high frequency signal #HCLK3 of, for example, 20 MHz. Thus, the first high frequency signal #HCLK1 sent to the second module 220 and third module 230 should be converted before use. For example, the second module 220 may comprise a first PLL circuit 222, converting the first high frequency signal #HCLK1 to the second high frequency signal #HCLK2, and a Bluetooth module 120 coupled to the first PLL circuit 222, operating at the second high frequency signal #HCLK2 when in busy mode. Similarly, the third module 230 comprises a second PLL circuit 232 to generate the third high frequency signal #HCLK3 from the first high frequency signal #HCLK1, and a WiFi module 130 performing WiFi operations at the third high frequency signal #HCLK3 when in busy mode.

Figure 3:
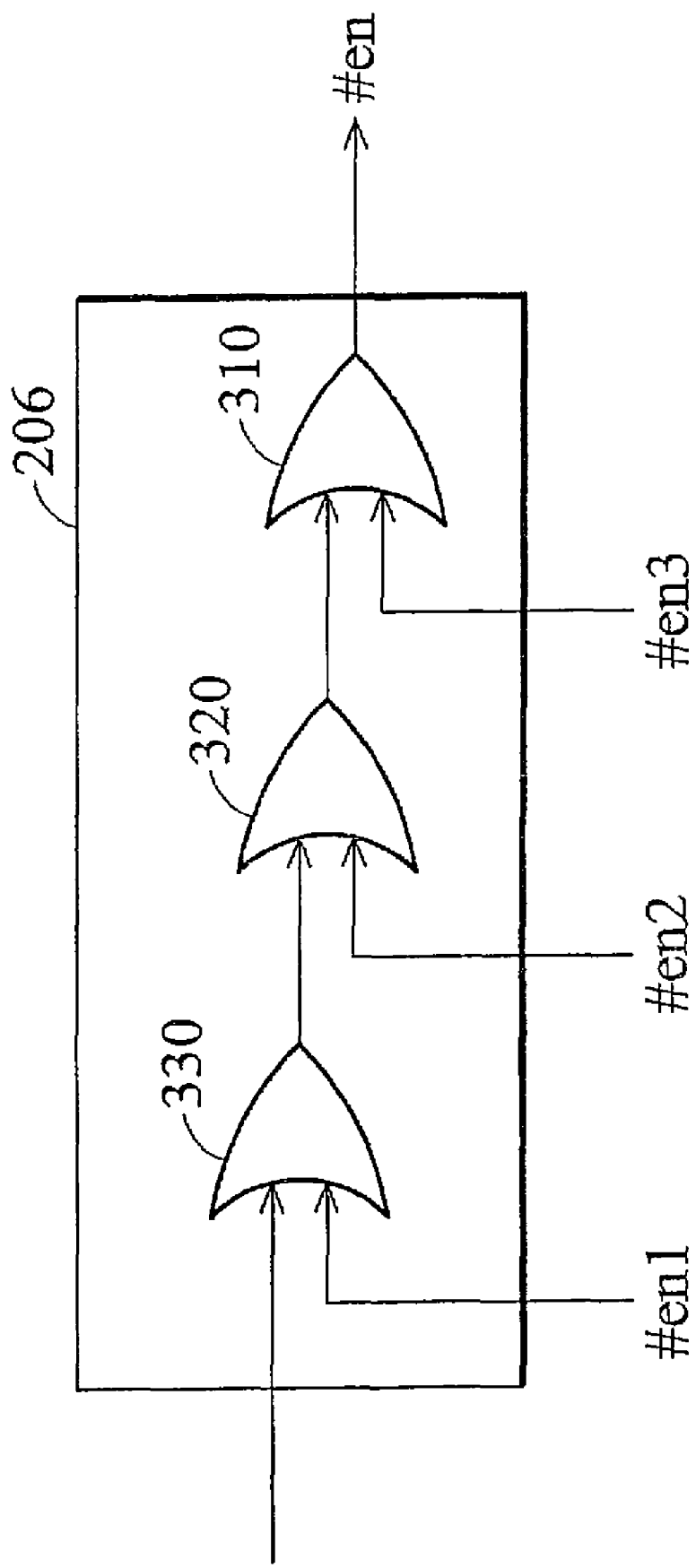
FIGS. 3, 6, 8 and 9 show embodiments of enablement units according to the invention.

FIG. 3 shows an embodiment of an enablement unit 206 according to FIGS. 2a and 2b. Since the enable signal #en is asserted when any of the request signals #en1, #en2 and #en3 is asserted, the enablement unit 206 may be implemented by OR gates 310, 320 and 330 serially cascaded, each receiving a corresponding enable signal. Based on the serially coupled architecture, the number of OR gates may be extended if more than three modules are implemented in the communication system 200 or 201. As shown in FIGS. 2a and 2b, the first module 210 comprises an auto frequency controller 208 controlling the accuracy of first high frequency signal #HCLK1. The first module 210 usually works in a mobile environment with varying effects, thus auto frequency control (AFC) is required to adjust the first high frequency signal #HCLK1 to adapt the frequency variations in communication. The auto frequency controller 208 generates an adjustment signal #AFC to fine tune the high frequency oscillator 202. The auto frequency controller 208 is triggered when the first request signal #en1 is asserted. In the embodiment, the adjustment signal #AFC is generated based on the enable signal #en.

Figure 1:
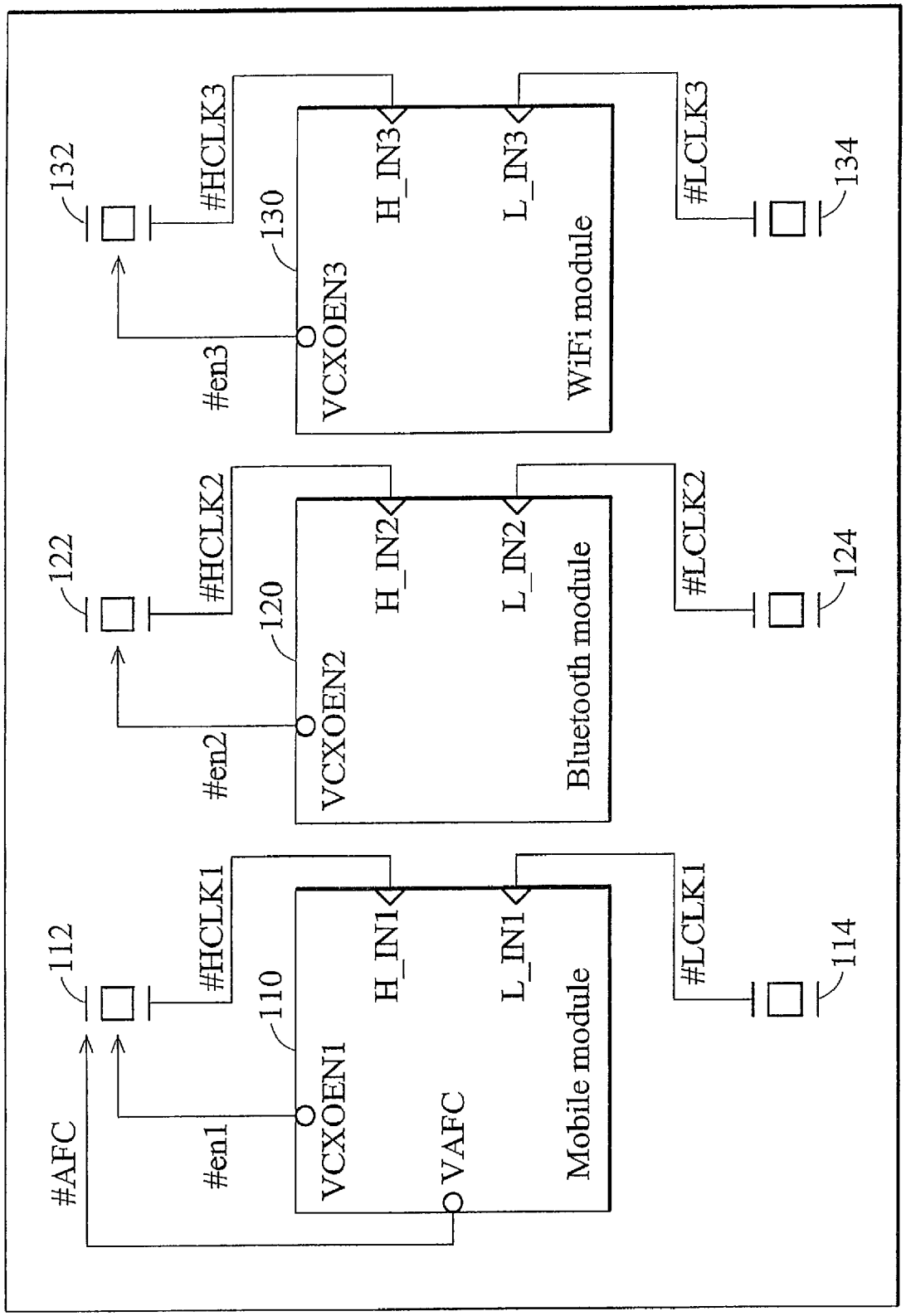
FIG. 1 shows a conventional communication system.
Figure 4:
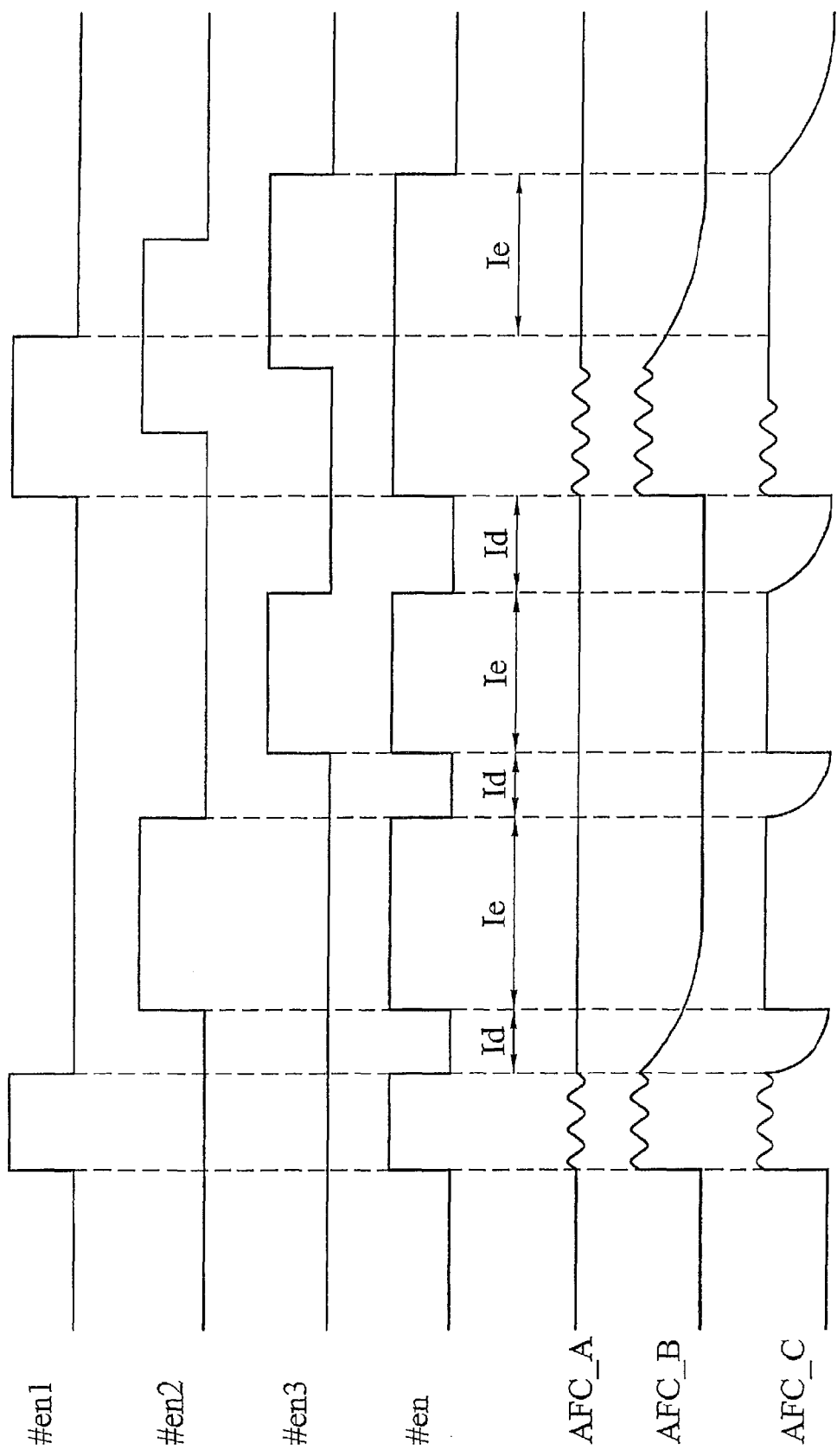
FIGS. 4 and 16 show exemplary waveforms of the enable signals and auto frequency control (AFC) signals.

FIG. 4 shows a waveform of the enable signals and the adjustment signals. The voltage curves AFC_A and AFC_B show voltage states of the adjustment signal #AFC in two conventional cases based on the architecture in FIG. 1. When the first request signal #en1 is asserted, the voltages AFC_A and AFC_B rapidly wobble as the auto frequency control proceeds. When the first request signal #en1 is disabled, the voltage AFC_A stays at a constant high level, whereas the voltage AFC_B is uncharged to a low level. If the voltages AFC_A and AFC_B are used in the architecture of FIGS. 2a and 2b, disadvantages may occur. In the intervals $I_d$ where all the request signals #en1, #en2 and #en3 are not active, the voltage AFC_A staying high is considered wasteful. Additionally, in the intervals $I_e$ where request signals #en2 or #en3 are enabled, the voltage AFC_B of low level causes the high frequency oscillator 202 to generate inaccurate first high frequency signal #HCLK1. To solve the disadvantages, the auto frequency controller 208 in FIGS. 2a and 2b is triggered based on the enable signal #en sent from the enablement unit 206, and the voltage status of the adjustment signal #AFC is shown as voltage AFC_C. When any of the request signals #en1, #en2 and #en3 is enabled, the enable signal #en is enabled, and the voltage AFC_C is sent as the adjustment signal #AFC to maintain the accuracy of first high frequency signal #HCLK1. During the intervals $I_d$ where none of the request signals #en1, #en2 and #en3 are asserted, the voltage AFC_C is uncharged to reduce the power consumption.

Figure 5:
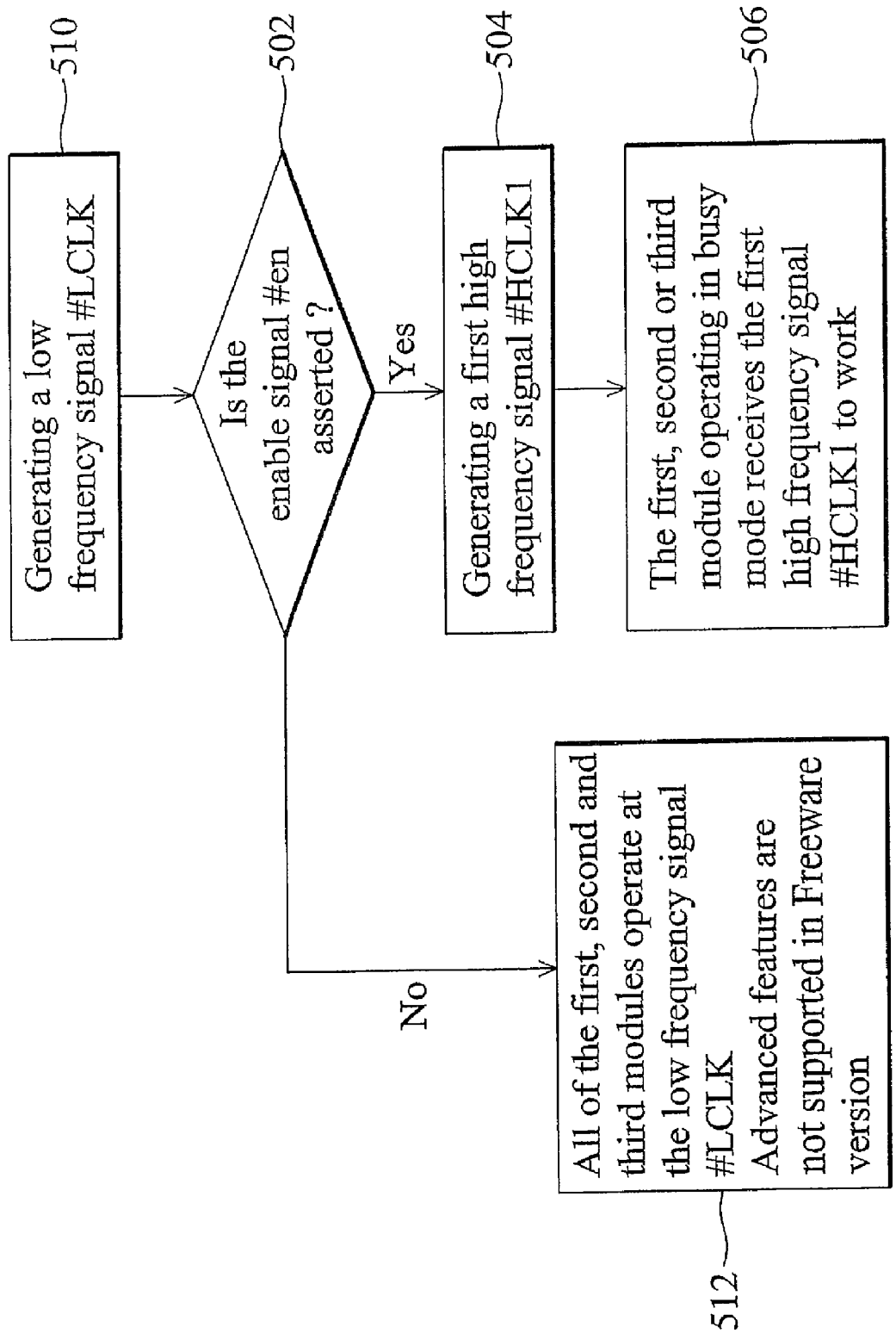
FIGS. 5 and 17 are flowcharts of embodiments of oscillation signal provision methods.

FIG. 5 is a flowchart of the oscillation signal provision method. The low frequency signal #LCLK is generated in step 510. In step 502, it is determined whether the enable signal #en has been asserted. If so, the first high frequency signal #HCLK1 is generated in step 504. In step 506, any of the first module 210, second module 220 and third module 230 which operates in busy mode utilizes the first high frequency signal #HCLK1 while the remainder of the first module 210, second module 220 and third module 230 which operates in idle mode utilizes the low frequency signal #LCLK. If the enable signal #en is not asserted, all of the first module 210, second module 220 and third module 230 are in idle mode, and as shown in step 512, all of them operate at the low frequency signal #LCLK.

Figures 6, 7:
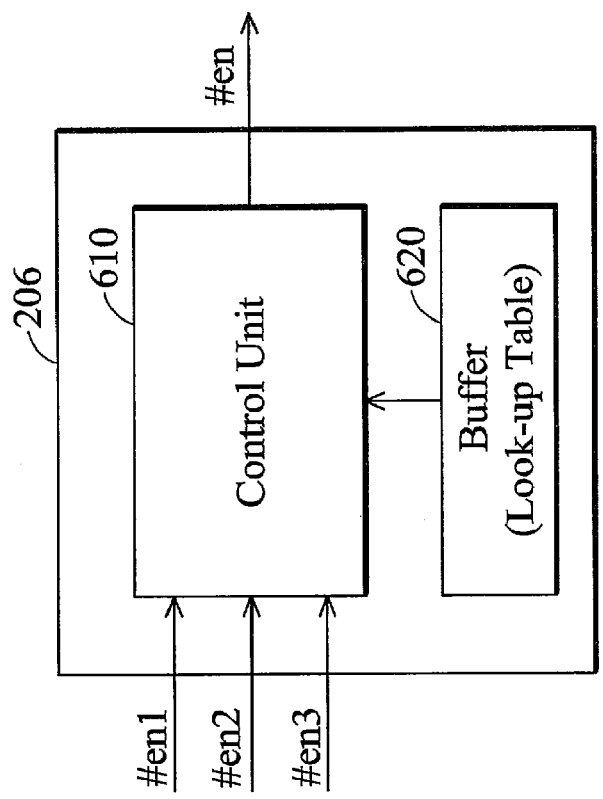
FIG. 7 shows an exemplary look-up table associated with the embodiment of the enablement unit of FIG. 6 according to the invention.
Figure 8:
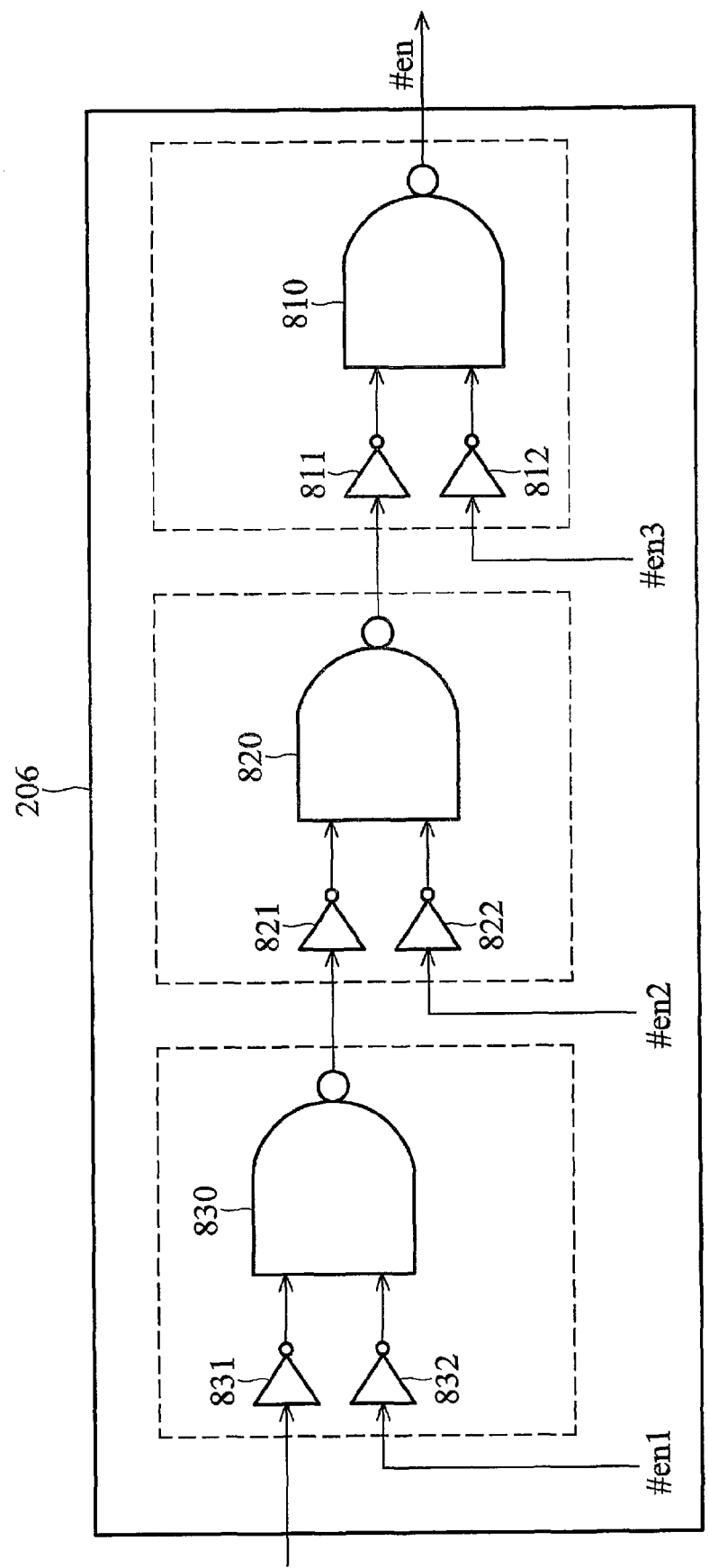
Figure 9:
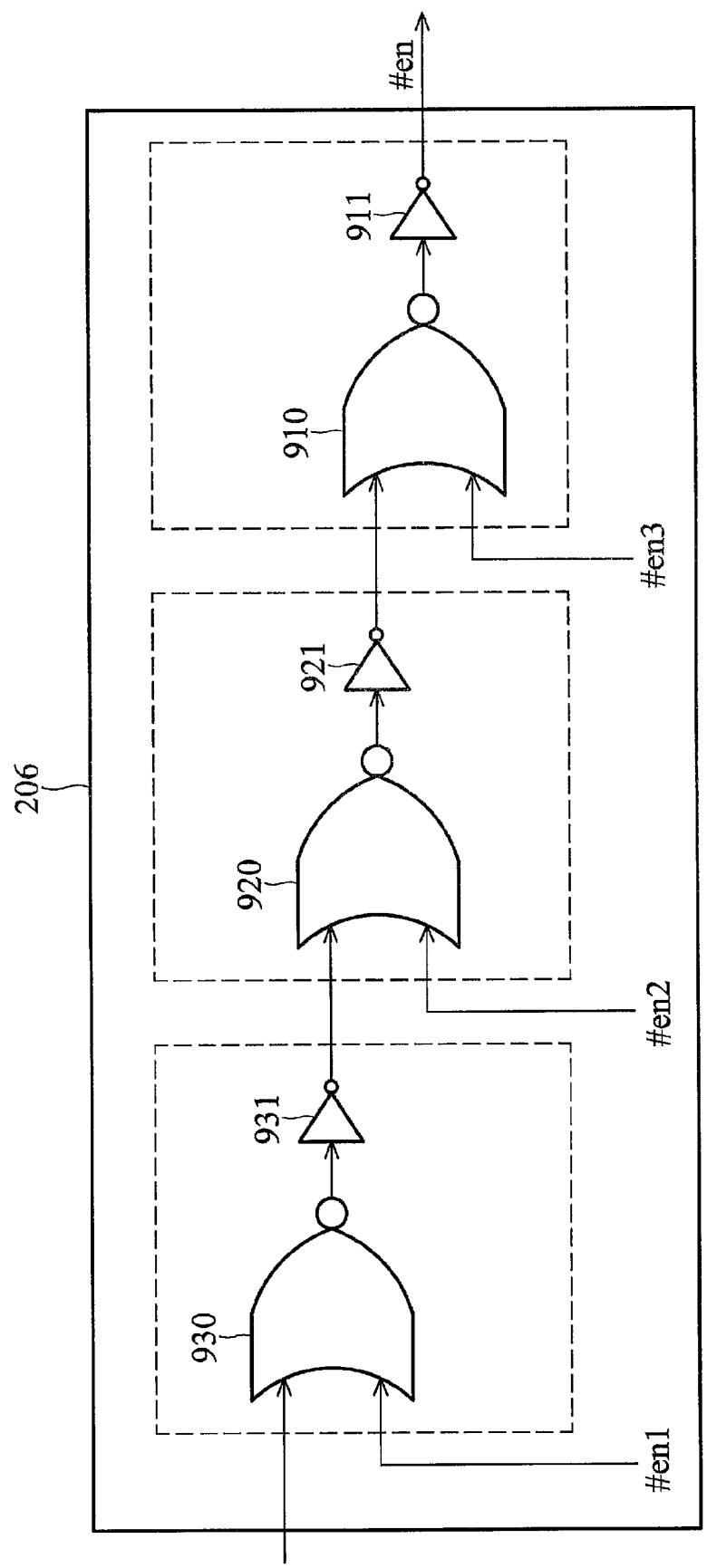

FIG. 6 shows an embodiment of the enablement unit 206 as shown in FIG. 2a or 2b. The enablement unit 206 may contain at least a buffer 620 storing a look-up table, and a control unit 610 selectively asserts the enable signal #en according to the request signals #en1, #en2 and #en3 and the stored look-up table. An exemplary look-up table can be shown in FIG. 7, in which "1" represents assertion. With reference to the look-up table, the control unit 410 asserts the enable signal #en when at least one of the request signal #en1, #en2 and #en3 is asserted. The buffer 620 may be implemented in registers, random access memory (RAM), read only memory (ROM), flash memory or others. FIG. 8 shows an embodiment of the enablement unit 206 as shown in FIG. 2a or 2b. Since the enable signal #en is asserted when any of the request signals #en1, #en2 and #en3 is asserted, the enablement unit 206 may be implemented by NAND gates 810, 820 and 830 serially cascaded with corresponding pairs of input inverters 811 and 812, 821 and 822, and 831 and 832, each receiving a corresponding enable signal. Based on the serially coupled architecture, the number of NAND gates with corresponding pairs of input inverters may be extended if more than three modules are implemented in the communication system 200 or 201. FIG. 9 shows an embodiment of the enablement unit 206 as shown in FIG. 2a or 2b. Since the enable signal #en is asserted when any of the request signals #en1, #en2 and #en3 is asserted, the enablement unit 206 may be implemented by NOR gates 910, 920 and 930 serially cascaded with corresponding output inverters 911, 921, and 931, each receiving a corresponding enable signal. Based on the serially coupled architecture, the number of NOR gates with corresponding output inverters may be extended if more than three modules are implemented in the communication system 200 or 201. Those skilled in the art may implement similar but different logic circuits in the enablement unit 206.

Figure 10A:
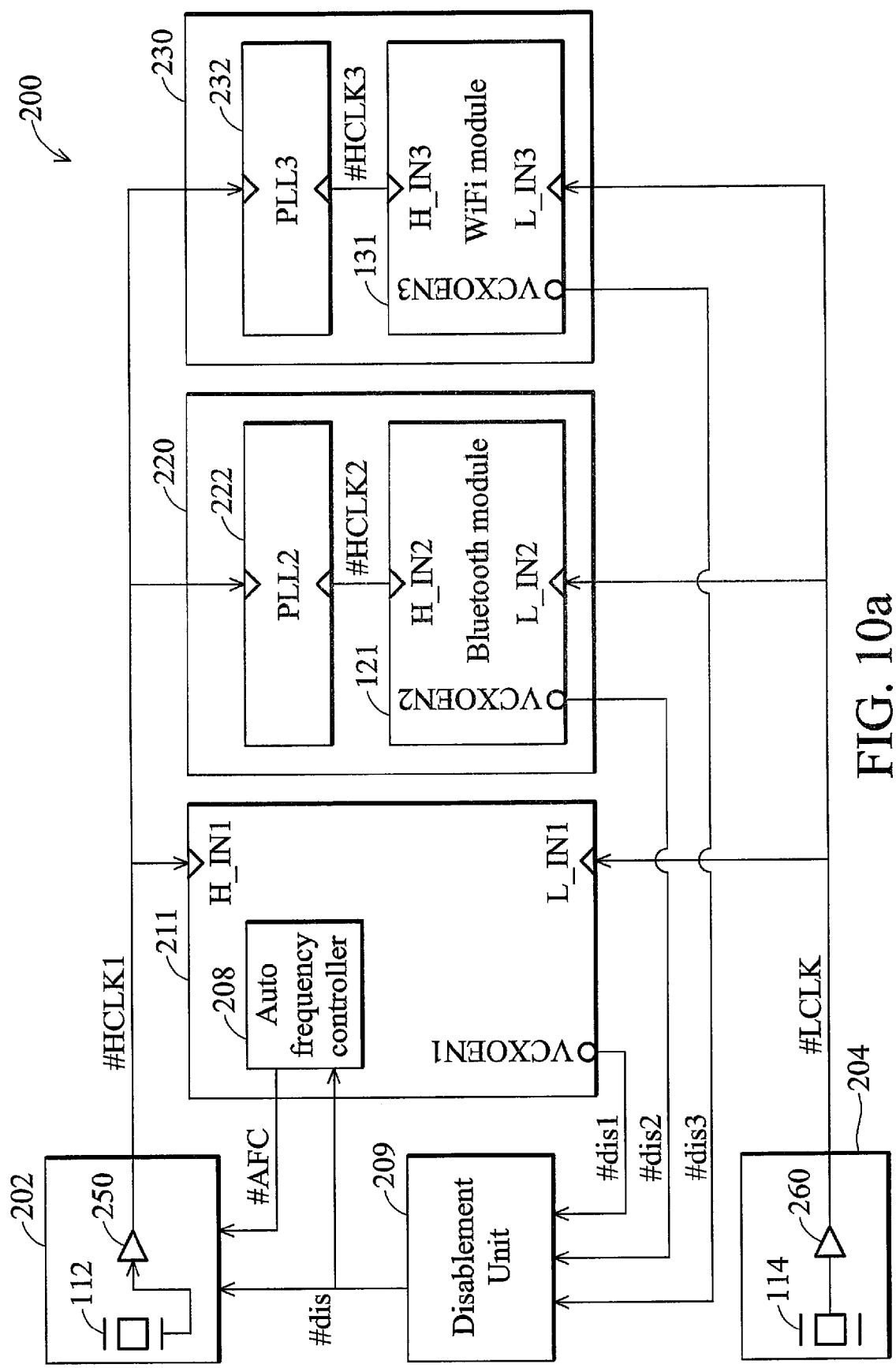
Figure 10B:
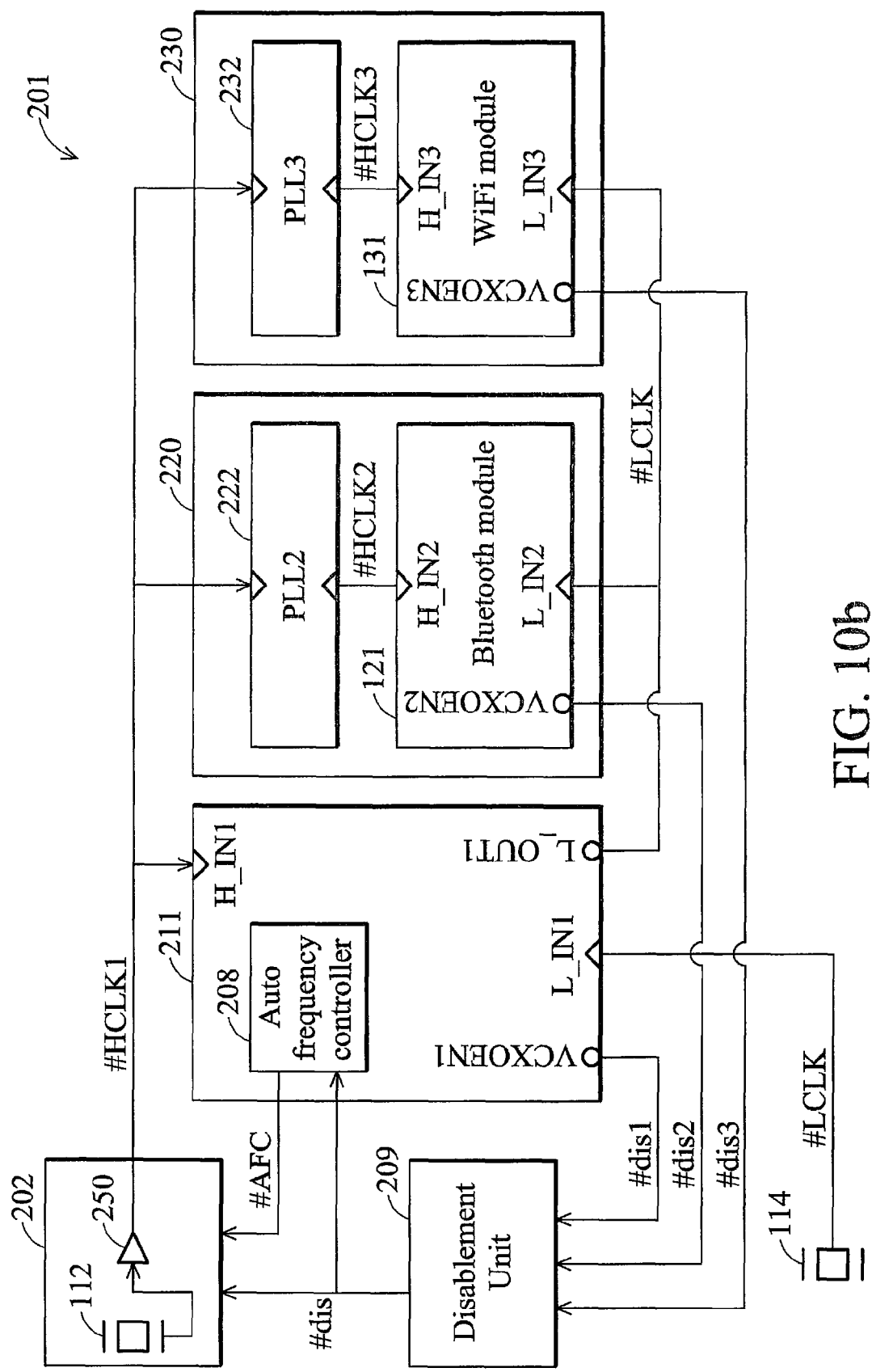

FIGS. 10a and 10b show embodiments of communication systems 200 and 201 according to the invention. In FIG. 10a, a communication system 200 comprises a first module 211, a second module 220 and a third module 230 sharing one high frequency oscillator 202 and one low frequency oscillator 204. Certain details of the high frequency oscillator 202, low frequency oscillator 204, modules 210, 220 and 230 may refer to the above description and are omitted herein for brevity. The high frequency oscillator 202 is disabled by a disable signal #dis sent from a disablement unit 209 coupled to the first module 210, second module 220 and third module 230. When one of the first module 210, second module 220 and third module 230 switches to idle mode, a corresponding one of request signals #dis1, #dis2 or #dis3 is delivered to the disablement unit 209. The disable signal #dis is asserted if all of request signals #dis1, #dis2 and #dis3 are asserted, and the high frequency oscillator 202 is disabled to stop generation of the first high frequency signal #HCLK1, reducing the total power consumption of the communication system 200. Conversely, if not all of request signals #dis1, #dis2 and #dis3 is asserted, the disable signal #dis is not sent to disable the high frequency oscillator 202, and the high frequency oscillator 202 may continue to work.

Figures 11, 12:
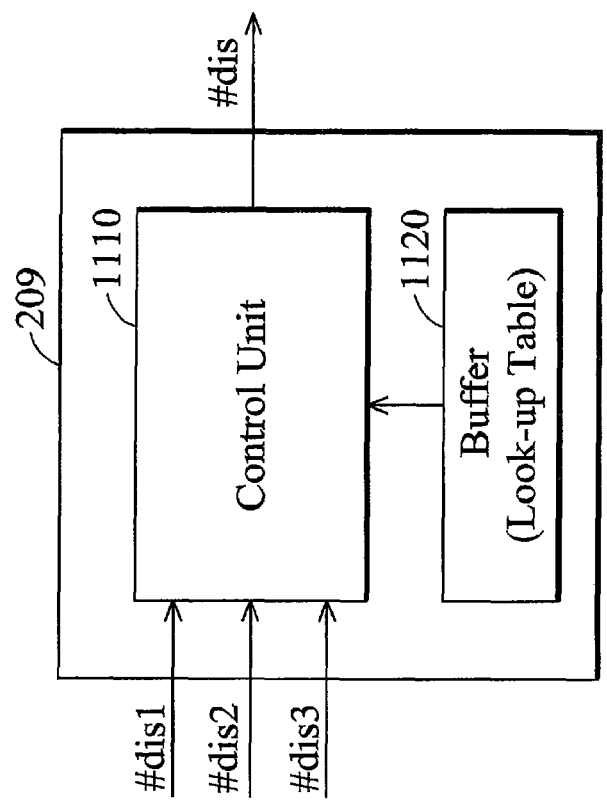
FIGS. 11, 13, 14 and 15 show embodiments of disablement units according to the invention.
FIG. 12 shows an exemplary look-up table associated with the embodiment of the disablement unit of FIG. 11 according to the invention.

FIG. 11 shows an embodiment of the disablement unit 209 as shown in FIG. 10a or 10b. The disablement unit 209 may contain at least a buffer 1120 storing a look-up table, and a control unit 1110 selectively asserts the disable signal #dis according to the request signals #dis1, #dis2 and #dis3 and the stored look-up table. An exemplary look-up table can be shown in FIG. 12, in which "1" represents assertion. The buffer 1120 may be implemented in registers, random access memory (RAM), read only memory (ROM), flash memory or others. With reference to the look-up table, the control unit 1110 asserts the disable signal #dis when all of request signals #en1, #en2 and #en3 are asserted.

Figure 13:
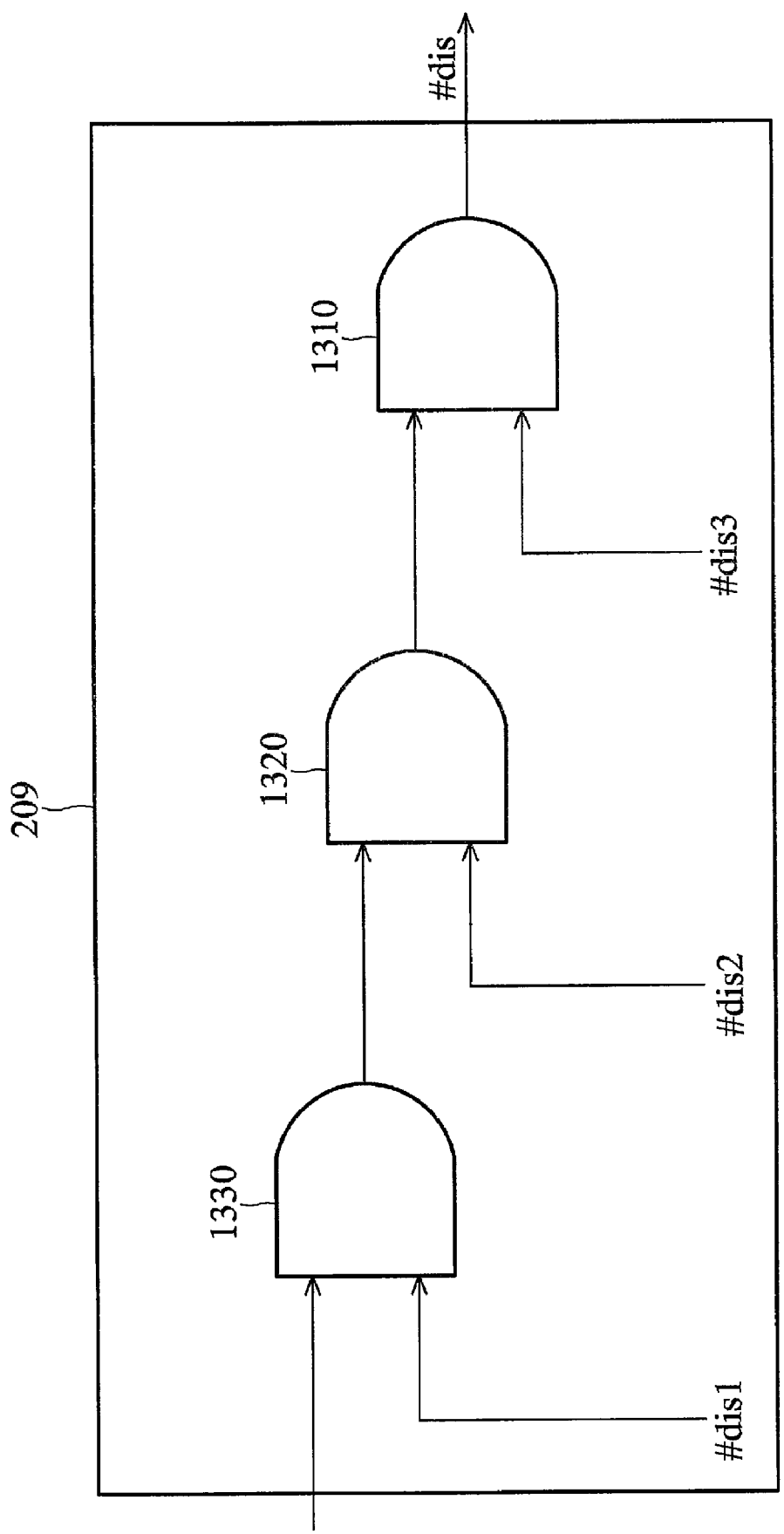
Figure 14:
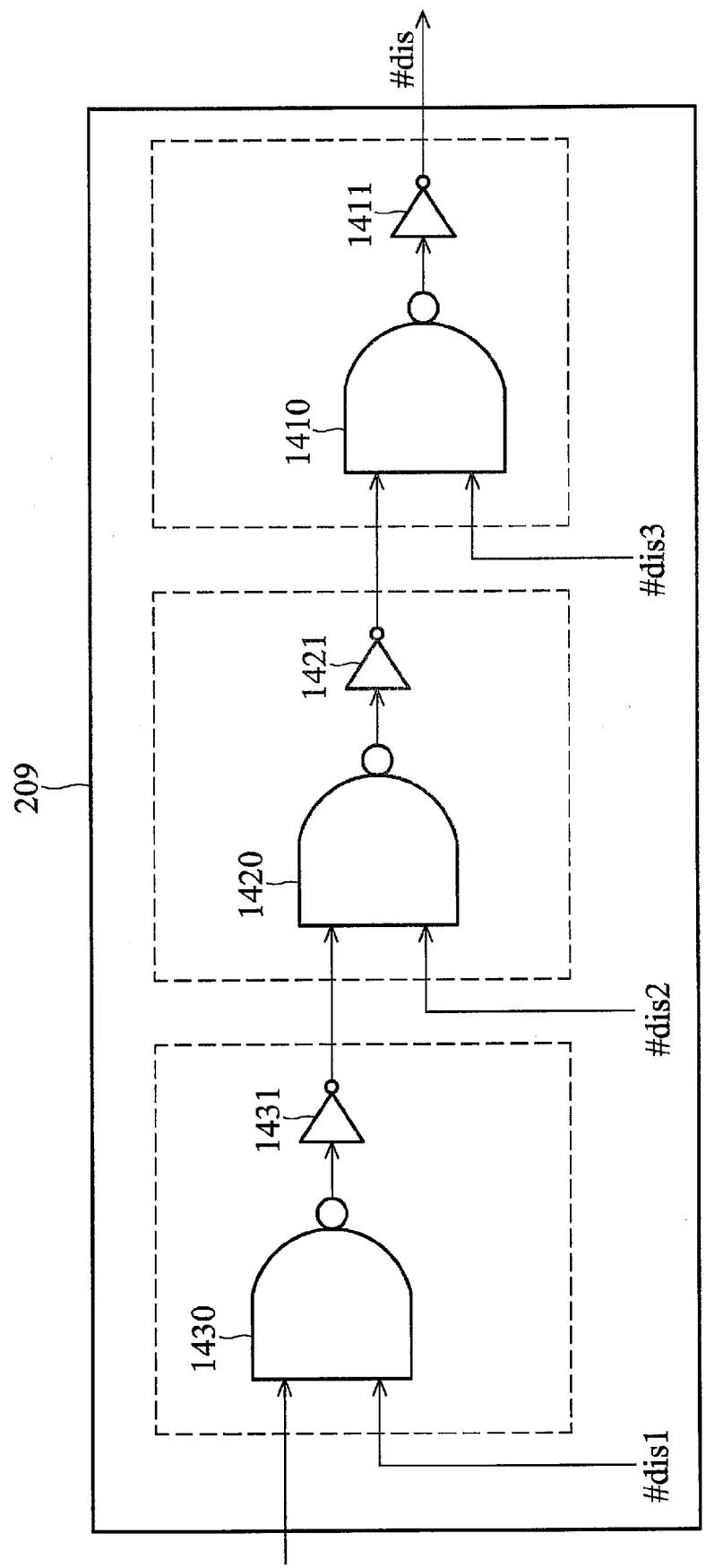
Figure 15:
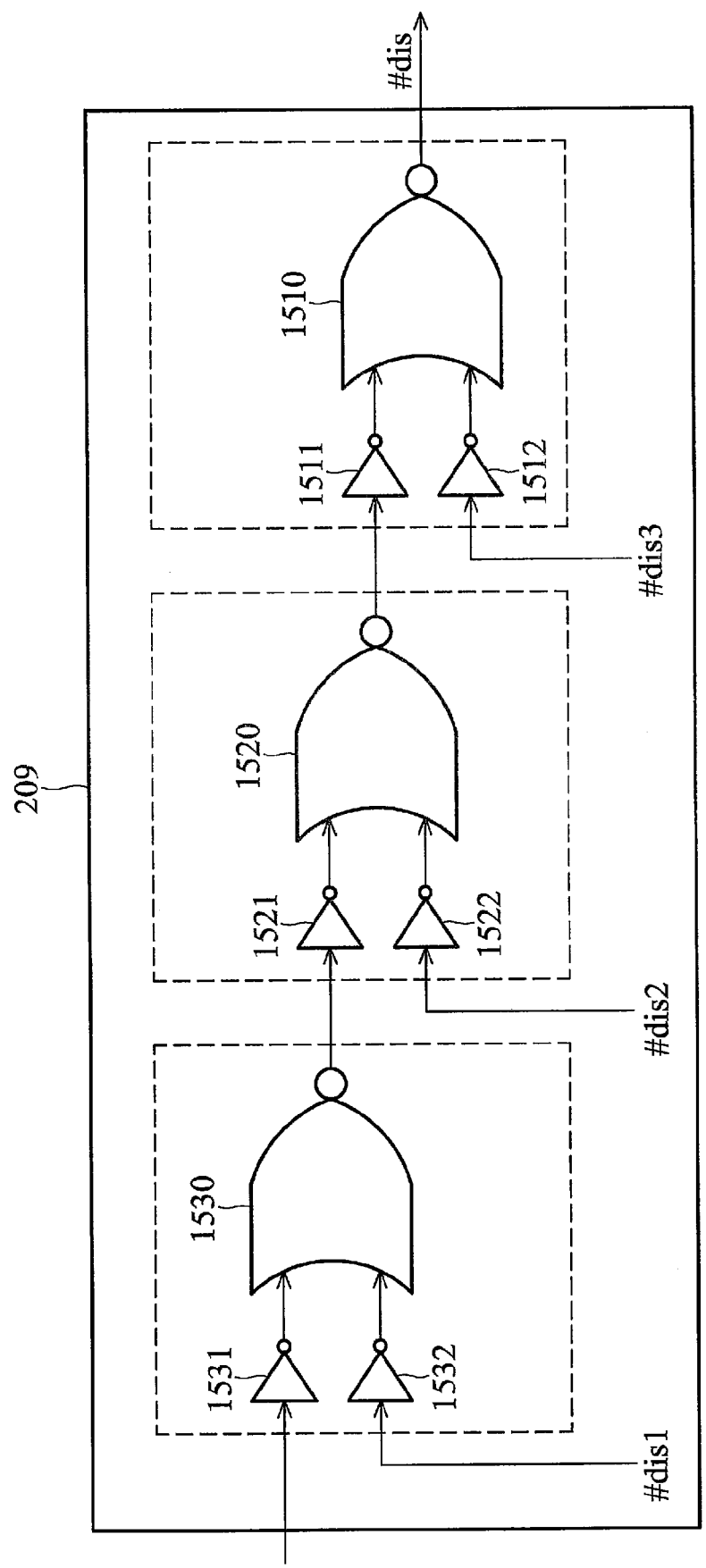

FIG. 13 shows an embodiment of the disablement unit 209 as shown in FIG. 10a or 10b. Since the enable signal #dis is asserted when all of request signals #dis1, #dis2 and #dis3 are asserted, the disablement unit 209 may be implemented by AND gates 1310, 1320 and 1330 serially cascaded, each receiving a corresponding disable signal. Based on the serially coupled architecture, the number of AND gates may be extended if more than three modules are implemented in the communication system 200 or 201. FIG. 14 shows an embodiment of the disablement unit 209 as shown in FIG. 10a or 10b. The disablement unit 209 may be implemented by NAND gates 1410, 1420 and 1430 serially cascaded with corresponding output inverters 1411, 1421, and 1431, each receiving a corresponding disable signal. Based on the serially coupled architecture, the number of NAND gates with corresponding output inverters may be extended if more than three modules are implemented in the communication system 200 or 201. FIG. 15 shows an embodiment of the disablement unit 209 as shown in FIG. 10a or 10b. The disablement unit 209 may be implemented by NOR gates 1510, 1520 and 1530 serially cascaded with corresponding pairs of input inverters 1511 and 1512, 1521 and 1522, and 1531 and 1532, each receiving a corresponding disable signal. Based on the serially coupled architecture, the number of NOR gates with corresponding pairs of input inverters may be extended if more than three modules are implemented in the communication system 200 or 201. Those skilled in the art may implement similar but different logic circuits in the disablement unit 209.

Figure 16:
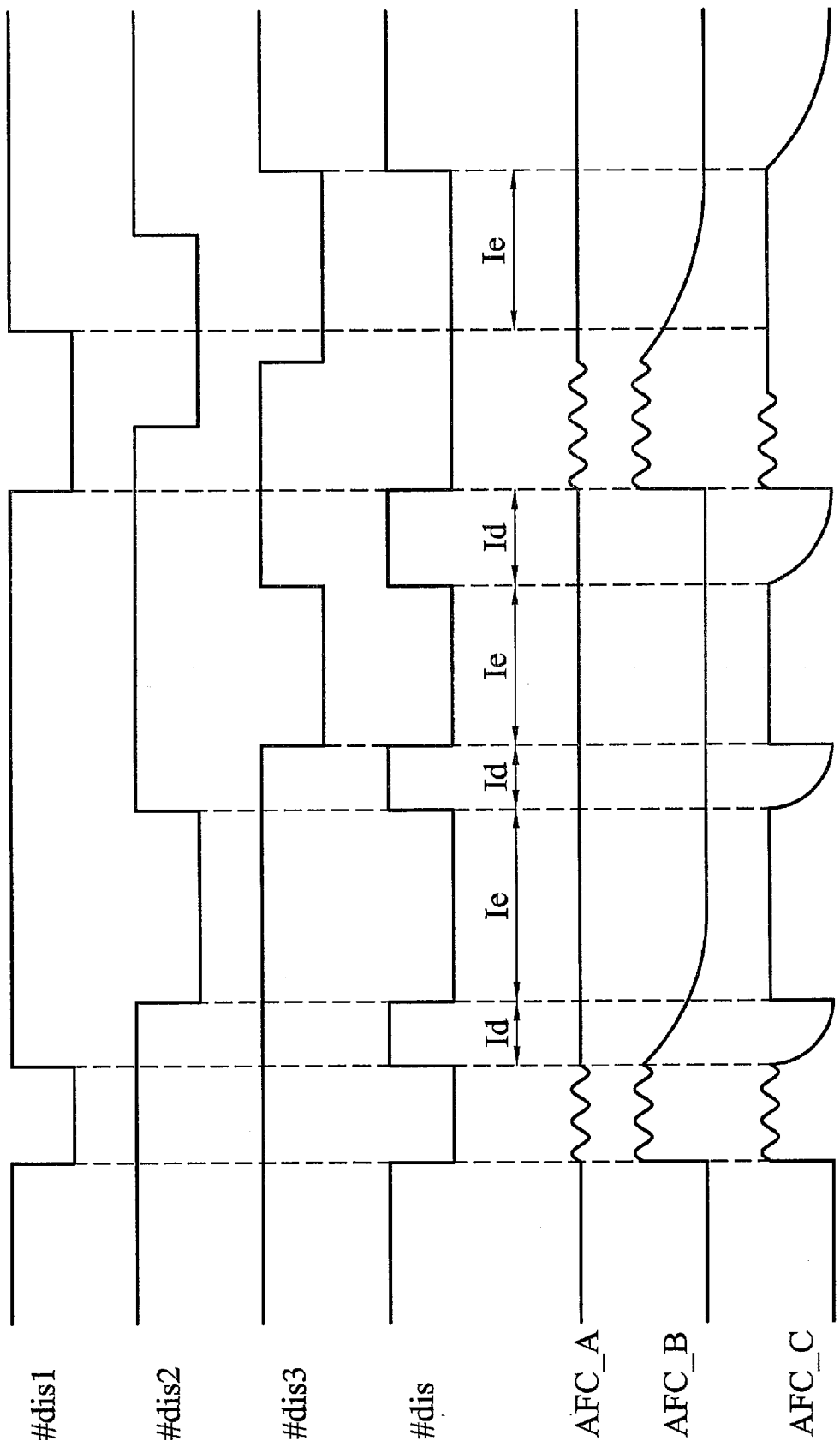

FIG. 16 shows a waveform of the disable signals and the adjustment signals. Disadvantages of the architecture in FIG. 1, FIG. 10a or 10b may refer to description of the FIG. 4. To solve the disadvantages, the auto frequency controller 208 in FIG. 10a or 10b is triggered based on the disable signal #dis sent from the disablement unit 209, and the voltage status of the adjustment signal #AFC is shown as voltage AFC_C. When all of request signals #dis1, #dis2 and #dis3 are asserted, the disable signal #dis is asserted, and the voltage AFC_C is sent as the adjustment signal #AFC to maintain the accuracy of first high frequency signal #HCLK1. During the intervals $I_d$ where all of request signals #dis1, #dis2 and #dis3 are asserted, the voltage AFC_C is uncharged to reduce the power consumption.

Figure 17:
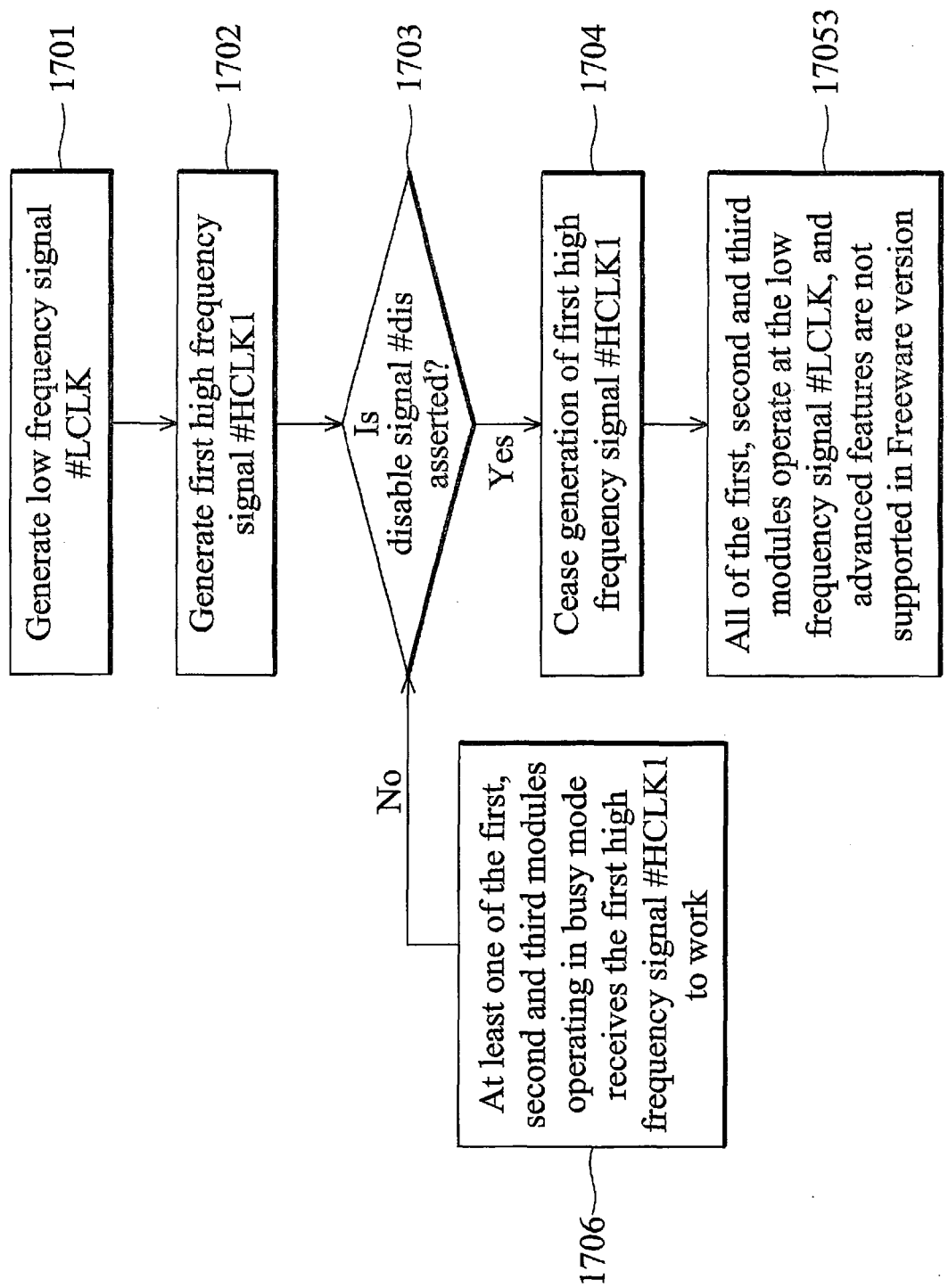

FIG. 17 is a flowchart of the oscillation signal provision method. The low frequency signal #LCLK is generated in step 1701. The first high frequency signal #HCLK1 is generated in step 1702 as well. In step 1703, it is determined whether the disable signal #dis has been asserted. If so, the generation of first high frequency signal #HCLK1 is ceased in step 1704, and then, as shown in step 1705, all of the first module 211, second module 220 and third module 230 are in idle mode and operate at the low frequency signal #LCLK. Otherwise, in step 1706, at least one of the first module 210, second module 220 and third module 230 operating in busy mode utilizes the first high frequency signal #HCLK1 while the remainder of the first module 210, second module 220 and third module 230 which operates in idle mode utilizes the low frequency signal #LCLK.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A communication system comprising:
    a high frequency oscillator, generating a first high frequency signal upon receipt no disable signal;
    at least two modules, each coupled to the high frequency oscillator, operating in either busy or idle mode, operating at the first high frequency signal when in busy mode, and asserting a request signal when in idle mode;
    a disablement unit, coupled to the modules for asserting the disable signal to the high frequency oscillator when all of the requests signals are asserted by the modules;
    wherein the high frequency oscillator ceases generating the first high frequency signal when the disable signal is asserted.

2. The communication system as claimed in claim 1, wherein the high frequency oscillator comprises:
    a first high oscillator, generating the first high frequency signal; and a first buffer, coupled to the first high oscillator, amplifying the gain of the first high frequency signal before output to the modules.

3. The communication system as claimed in claim 1, further comprising a low frequency oscillator, comprising:
an oscillation source, generating a low frequency signal; and
a second buffer, coupled to the oscillation source, amplifying the gain of the low frequency signal; wherein the modules are coupled to the low frequency oscillator, individually operating at the low frequency signal when in idle mode.

4. The communication system as claimed in claim 1, further comprising an oscillation source providing a low frequency signal; wherein a first module of the modules is coupled to the low frequency oscillator, operating at the low frequency signal when in idle mode.

5. The communication system as claimed in claim 4, wherein:
the first module is coupled to the other modules, amplifying and passing the low frequency signal to the other modules; and
each of the other modules operates at the low frequency signal when in idle mode.

6. The communication system as claimed in claim 1, wherein each of the other modules comprises:
a PLL circuit, receiving the first high frequency signal and generating a second high frequency signal; and
an operation module, coupled to the PLL circuit, operating at the second high frequency signal in busy mode.

7. The communication system as claimed in claim 1, wherein one of the module is a mobile phone chip.

8. The communication system as claimed in claim 1, wherein one of the modules is a Bluetooth chip.

9. The communication system as claimed in claim 1, wherein one of the modules is a WiFi chip.

10. The communication system as claimed in claim 1, wherein the disablement unit comprises an AND gate, triggered by the request signals to generate the disable signal.

11. The communication system as claimed in claim 1, wherein the disablement unit comprises an NAND gate with a output inverter, triggered by the request signals to generate the disable signal.

12. The communication system as claimed in claim 1, wherein the disablement unit comprises an NOR gate with a pair of input inverters, triggered by the request signals to generate the disable signal.

13. The communication system as claimed in claim 1, wherein the disablement unit comprises a buffer storing a look-up table and a control unit for generating the disable signal with reference to the request signals and the look-up table.

14. The communication system as claimed in claim 1, wherein:
a first module of the modules comprises an automatic frequency controller coupled to the high frequency oscillator, generating an adjustment signal to maintain the accuracy of first high frequency signal upon receipt no disable signal; and
the automatic frequency controller ceases generating the adjustment signal when the disable signal is asserted.

15. An oscillation signal provision method for a first module and a second module each operating in either busy or idle mode, the method comprising:

generating a first high frequency signal when no disable signal is asserted;
at least two modules each operating at the first high frequency signal when in busy mode and asserting a request signal when in idle mode;
asserting disable signal when all of the request signals are asserted; and
ceasing generation of the first high frequency signal when the disable signal is asserted.

16. The oscillation signal provision method as claimed in claim 15, wherein generation of first high frequency signal comprises amplifying the gain of the first high frequency signal and sending to the modules.

17. The oscillation signal provision method as claimed in claim 15, further comprising:
providing a low frequency signal;
amplifying the gain of the low frequency signal and sending to the modules; and
each module operating at the low frequency signal when in idle mode.

18. The oscillation signal provision method as claimed in claim 15, further comprising:
providing a low frequency signal; and
a first module of the modules receiving and operating at the low frequency signal when in idle mode.

19. The oscillation signal provision method as claimed in claim 18, further comprising:
the first module amplifying and passing the low frequency signal to the other modules; and
the other modules operating at the low frequency signal when in idle mode.

20. The oscillation signal provision method as claimed in claim 15, further comprising a first module of the modules performing an automatic frequency control to maintain the accuracy of first high frequency signal when the disable signal is not asserted.

21. A communication system comprising:
a high frequency oscillator, generating a first high frequency signal upon receipt of an enable signal;
at least two modules, each coupled to the high frequency oscillator, operating in either busy or idle mode, wherein each module operates at the first high frequency signal when in busy mode and asserts a request signal when in busy mode; and
an enablement unit, coupled to the modules for generation of the enable signal when at least one request signal is asserted; wherein the high frequency oscillator ceases generating the first high frequency signal when the enable signal is not asserted.

22. The communication system as claimed in claim 21, wherein the enablement unit comprises an NAND gate with a pair of input inverters, triggered by at least one of the request signals to generate the enable signal.

23. The communication system as claimed in claim 21, wherein the enablement unit comprises an NOR gate with a output inverters, triggered by at least one of the request signals to generate the enable signal.

24. The communication system as claimed in claim 21, wherein the enablement unit comprises a buffer storing a look-up table and a control unit for generating the enable signal with reference to the request signals and the look-up table.

* * * * *